(12) United States Patent
Steeneken et al.

(10) Patent No.: US 8,339,764 B2
(45) Date of Patent: Dec. 25, 2012

(54) MEMS DEVICES

(75) Inventors: Peter G. Steeneken, Valkenswaard (NL); Hilco Suy, Hulst (NL); Martijn Goossens, Veldhoven (NL)

(73) Assignee: NXP B.V., Eindhoven (NL)

( * ) Notice: Subject to any disclaimer, the term of this patent is extended or adjusted under 35 U.S.C. 154(b) by 232 days.

(21) Appl. No.: 12/990,158

(22) PCT Filed: May 7, 2009

(86) PCT No.: PCT/IB2009/051879
§ 371 (c)(1),
(2), (4) Date: Oct. 28, 2010

(87) PCT Pub. No.: WO2009/138919
PCT Pub. Date: Nov. 19, 2009

(65) Prior Publication Data
US 2011/0051312 A1     Mar. 3, 2011

(30) Foreign Application Priority Data
May 12, 2008   (EP) .................................... 08103927

(51) Int. Cl.
*H01G 7/00*     (2006.01)

(52) U.S. Cl. ..... 361/281; 361/277; 361/279; 361/283.1; 361/290; 361/292

(58) Field of Classification Search .................. 361/279, 361/281, 283.1, 283.3, 284, 287, 290–292, 361/277–278
See application file for complete search history.

(56) References Cited

U.S. PATENT DOCUMENTS

| | | | |
|---|---|---|---|
| 6,109,113 A | 8/2000 | Chavan et al. | |
| 6,168,395 B1 | 1/2001 | Quenzer et al. | |
| 6,215,644 B1 * | 4/2001 | Dhuler | 361/280 |
| 6,394,242 B1 | 5/2002 | Allaei | |
| 6,854,330 B2 * | 2/2005 | Potter | 73/514.25 |
| 6,975,498 B2 * | 12/2005 | Kato | 361/277 |
| 7,085,122 B2 * | 8/2006 | Wu et al. | 361/277 |
| 7,242,569 B2 * | 7/2007 | Hunt et al. | 361/277 |
| 7,545,622 B2 * | 6/2009 | Morris et al. | 361/290 |
| 2006/0056132 A1 | 3/2006 | Yoshida et al. | |
| 2006/0229045 A1 | 10/2006 | Choi et al. | |

FOREIGN PATENT DOCUMENTS

| | | |
|---|---|---|
| EP | 1517344 A1 | 3/2005 |
| SU | 1332410 A1 | 8/1987 |
| WO | 9638850 A1 | 12/1996 |
| WO | 97/39464 A1 | 10/1997 |
| WO | 2006046194 A1 | 5/2006 |

OTHER PUBLICATIONS

Steeneken, P. G., et al; "Dynamics and Squeeze Film Gass Damping of a Capacitive RF MEMs Switch"; J. Micromech. Microeng 15; p. 176; (2005).
International Search Report for Application PCT/IB2009/051879 (May 7, 2009).

* cited by examiner

*Primary Examiner* — Nguyen T Ha (57) ABSTRACT

A MEMS device comprises first and second opposing electrodes (42,46), wherein the second electrode (46) is electrically movable to vary the electrode spacing between facing first sides of the first and second electrodes. A first gas chamber (50) is provided between the electrodes, at a first pressure, and a second gas chamber (52) is provided on the second, opposite, side of the second electrode at a second pressure which is higher than the first pressure. This arrangement provides rapid switching and with damping of oscillations so that settling times are reduced.

13 Claims, 9 Drawing Sheets

MEMS DEVICES

TITLE

This invention relates to MEMs (micro electromechanical system) devcies.

BACKGROUND OF THE INVENTION

MEMs technology is being used increasingly in electronic devices. Switches and tunable capacitors are examples of circuit components that can be made using MEMs technology.

MEMs switches can be used in a wide variety of applications, where high speed, typically low current, switching is required within a circuit. A MEMs switch has the advantage of a large capacitance switching range.

MEMs capacitors can also be used in a variety of circuits, such as tunable filters, tunable phase shifters and tunable antennas. One application of growing interest is in RF and microwave communications systems, for example for use in low cost reconfigurable/tunable antennas.

Figure 1:
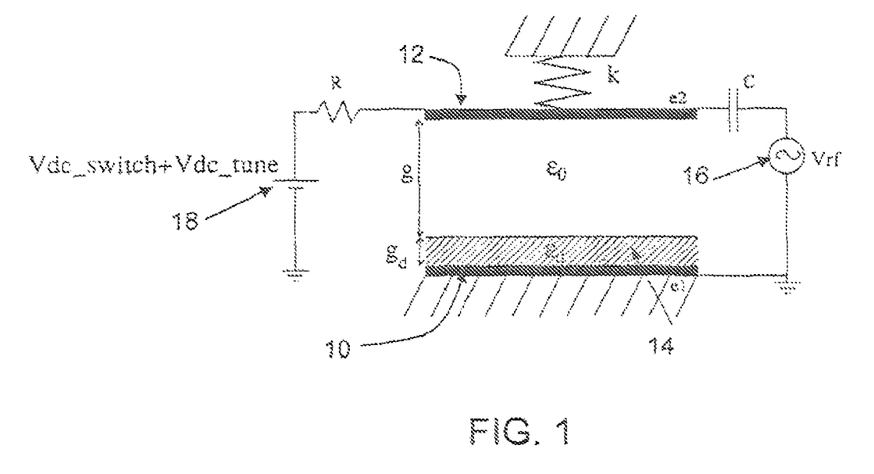
FIG. 1 shows a MEMS device which combines an electrically tunable dielectric and a MEMS switch function.

FIG. 1 shows a MEMS capacitor with an electrically tunable dielectric and MEMS controlled dielectric spacing. The dielectric spacing is controlled in the manner of a switch, but the analogue electrical control of the dielectric properties can enable continuous tunability of the capacitor.

A tunable dielectric, ferroelectric or piezoelectric material can be used, such as $Ba_{1-x}Sr_xTiO_3$ or PZT as a dielectric layer 14. By combining a MEMS capacitor with a tunable dielectric, the advantages of the large capacitance switching range of RF MEMS switches are added to the advantages of the continuous tuning capability of tunable dielectrics. Moreover, use is made of the beneficial high dielectric constant of ferroelectrics, which can be 10-200 times higher than that of conventional dielectrics like Silicon Nitride. This dramatically reduces device size and increases continuous tuning range.

The device comprises opposite capacitor plates 10 (e1)) and 12 (e2). The gap g is controlled by the MEMS switch represented by the spring k, based on the voltage applied to the plate 12. A dc voltage Vdc_switch is used to provide this MEMS switching function, from a dc voltage source 18. An rf ac voltage source 16 represents the rf signal that is flowing through the MEMS device during operation. The tunable dielectric has a tunable dielectric value $\in_d$, whereas the remaining dielectric spacing is air or vacuum, with dielectric value $\in_0$. The tunable dielectric is controlled by the voltage Vdc_tune, so that the single voltage applied to the electrode 12 controls the MEMS switching and dielectric tuning. The capacitor C and resistor R are optional decoupling components.

Of course, if a non-tunable dielectric is used, the MEMs device can be used simply as a capacitive switch (low frequency or rf frequency). Alternatively, if no dielectric is provided, the device can be used as a galvanic switch.

Switches/tunable capacitors of the type shown in FIG. 1 are usually operated in a gas atmosphere at a pressure close to 1 bar. A drawback of the presence of this gas is that it exerts a damping force on the moving electrode of the switch, which reduces its speed. Because the gas needs to be 'squeezed' away between the electrodes, this damping force is sometimes called the 'squeeze film damping' force, and is approximately given by:

$$F_d = -b\frac{v}{z^3} \quad [1]$$

In equation [1], v is the speed of the electrode, b is a constant that depends on the geometry of the switch, and z is the separation between the plates. Clearly, the damping force increases tremendously when the plates approach each other and z becomes small. This strongly limits the switching time both for opening and for closing of the switch.

An obvious and well-known solution to this problem is to operate the switch in a vacuum or low pressure. At the limit, the gas damping force becomes close to zero and the switch closes and opens very quickly.

However this solution does have another drawback: when the switch opens, the spring-mass system is strongly underdamped and the electrode will oscillate for a long time before finally coming to a relaxed position. This increases the effective opening time (usually the switch can only be used after stabilizing, particularly in the case of capacitive MEMS switches).

Figure 2:
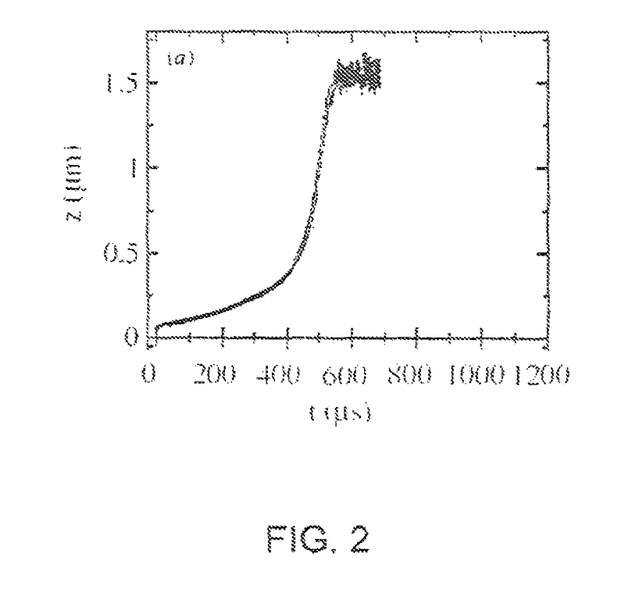
FIG. 2 shows how the movable electrode moves in a known MEMS switch using atmospheric pressure between the electrodes.

FIG. 2 shows the opening of a capacitive MEMs switch at atmospheric pressure (1000 mbar). The opening speed is low, especially when the electrode gap z is very small.

Figure 3:
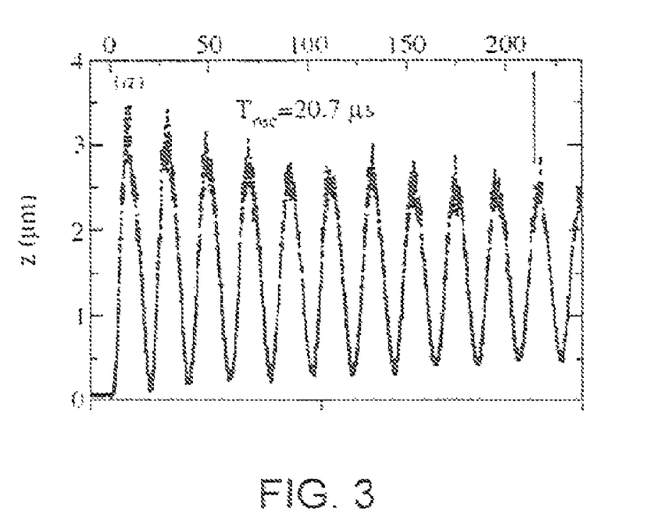
FIG. 3 shows how the movable electrode moves in a known MEMS switch using a partial vacuum between the electrodes.

FIG. 3 shows the opening of the same capacitive MEMs switch at a low pressure (1.4 mbar). Because the gas damping is very small, it takes many oscillations for the switch to relax to a stable position.

According to the invention, there is provided a MEMS device comprising:

first and second opposing electrodes, wherein the second electrode is electrically movable to vary the electrode spacing between facing first sides of the first and second electrodes, wherein the second electrode is at a spaced position from the first electrode in a relaxed state in which no voltages are applied to the electrodes, wherein a first gas chamber is provided between the electrodes, at a first pressure, and a second gas chamber is provided on the second, opposite, side of the second electrode at a second pressure which is higher than the first pressure.

This arrangement enables movement of the second electrode towards the first electrode without needing to displace significant volumes of fluid, as the chamber between the electrodes is at a relatively low pressure. The movement of the second electrode towards the relaxed position is damped by the second gas chamber so as to prevent unwanted oscillations. The invention thus provides the ability for high speed switching, whilst also reducing settling times.

The first gas chamber is preferably at a pressure below 500 mbar, and the second gas chamber is at atmospheric pressure or higher than atmospheric pressure. For example, the first gas chamber can be at a pressure below 100 mbar, or even below 50 mbar, namely at a partial vacuum pressure. The second gas chamber can for example be at atmospheric pressure. This simplifies the manufacture as the chamber does not need to be pressurised or depressurized as part of the manufacturing process.

The first gas chamber can have a height of between 50 nm and 50 μm and the second gas chamber can have a height of between 1 μm and 200 μm. The electrostatic control is across the first gas chamber, which has a relatively small height, whereas the second gas chamber is used for mechanical damping only, and therefore can have greater height.

One or more stops can be provided in the second gas chamber, for limiting movement of the second electrode away from the first electrode. These can assist further in damping oscillations as the second electrode moves to its relaxed state.

The second electrode can be clamped between elastic members around a portion of the second electrode which defines the outer periphery of the first and second gas chambers. Again, this can be used to provide damping of the movement of the second electrode.

The second electrode can comprise a metal electrode layer, a piezoelectric layer and a circuit for dissipating electrical energy generated by the piezoelectric layer. This arrangement uses the conversion of mechanical to electrical energy as a further possible way to provide damping of the movement of the second electrode. A circuit can then be provided for controlling the actuation of the piezoelectric layer to provide active damping.

The device of the invention can for example comprises a MEMs switch (either a capacitive switch having a dielectric layer between the first and second electrodes, or a galvanic switch in which the second electrode is movable to make and break contact with the first electrode).

The invention also provides a method of controlling the movement of an electrically movable electrode of a MEMS device towards and away from a fixed electrode, wherein the movable electrode is at a spaced position from the fixed electrode in a relaxed state in which no voltages are applied to the electrodes, the method comprising:

providing a first gas chamber provided between the electrodes with a first pressure;

providing a second gas chamber provided on an opposite side of the movable electrode facing away from the fixed electrode with a second pressure which is higher than the first pressure.

BRIEF DESCRIPTION OF THE DRAWINGS

Examples of the invention will now be described in detail with reference to the accompanying drawings, in which.

DETAILED DESCRIPTION

The same reference numbers are used in different figures to denote the same components. In FIGS. 9 to 18, the description of layers is not repeated when the same layers appear in different figures.

The invention provides a MEMS device in which the movable electrode provides a barrier between two gas chambers. A first gas chamber is between the movable electrode and a fixed electrode, and is at a low pressure so that the movable electrode can move quickly towards the fixed electrode. A second gas chamber is on the opposite side of the movable electrode, and this acts as a damping device, to remove oscillations when the movable electrode returns to its relaxed position.

Figure 4:
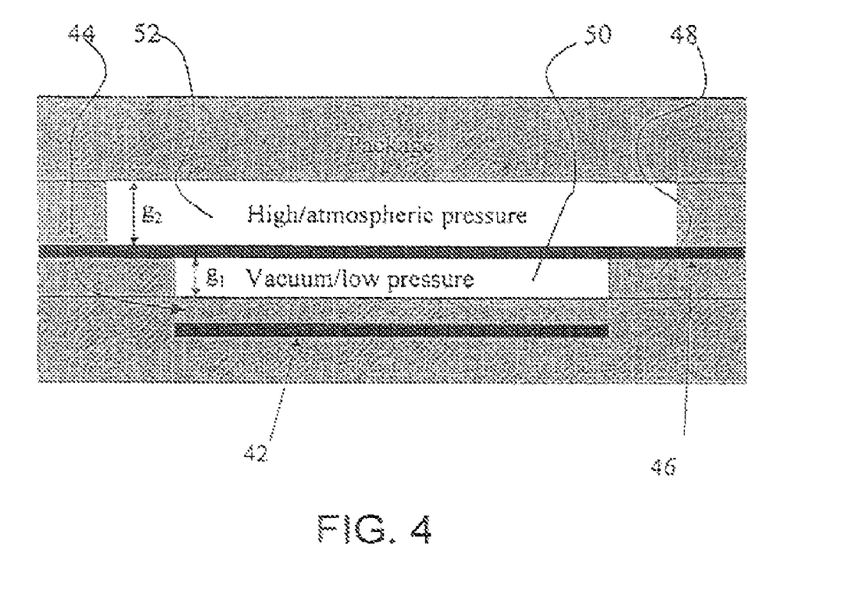
FIG. 4 shows a first example of MEMS device of the invention.

FIG. 4 shows a first example of MEMS device of the invention, comprising a lower substrate assembly which includes a lower first electrode 42. This example is a capacitive switch, and the lower substrate assembly includes a dielectric layer 44 over the first, fixed electrode 42.

The second, movable electrode 46 is suspended over the first electrode, and is supported by a closed support 48 so that a first sealed gas chamber is defined between the electrodes. The second electrode is in the form of a deformable membrane, and it provides a hermetic seal of the first gas chamber. This chamber is provided with a low pressure, in particular a partial vacuum. A second gas chamber 52 is defined above the second electrode, by the materials of the device package, and this is at a higher pressure, such as atmospheric pressure.

The lower gas chamber has a height g1, and the upper has chamber has a height g2.

The height g1 is between 50 nm and 50 μm, for example between 100 nm and 10 μm, more preferably between 100 nm and 5 μm. The height g2 can be larger as it is used for mechanical damping only and not for electrostatic actuation. For example g2 can be between 1 μm and 200 μm, for example between 10 μm and 100 μm.

By applying a high pressure in a small gap above the switch, and a low pressure below the switch, the so-called squeeze film damping forces are small when the switch is closed, but they become significant when the switch is in the open position. By tuning the gap size $g_2$ and the pressure in the second chamber, the required damping can be achieved.

In this way, a small damping is provided when the gap z between the electrodes is small, to prevent slow opening as explained with reference to FIG. 2, but large enough damping is provided when the switch is opened to prevent oscillations as explained with reference to FIG. 3.

Figure 5:
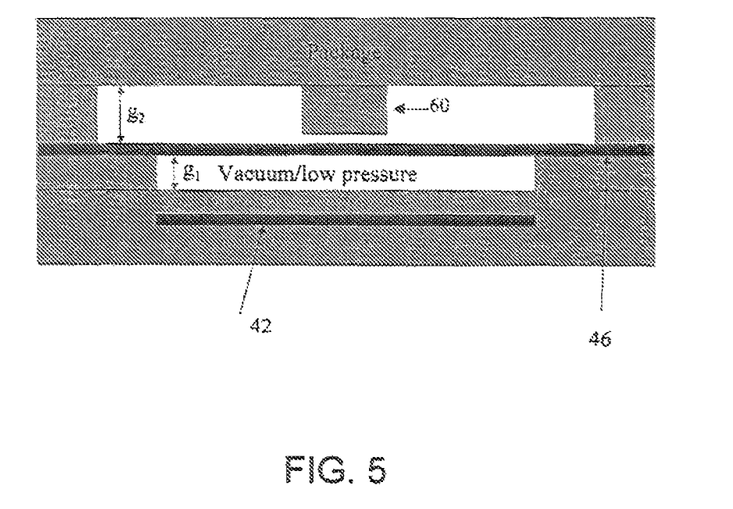
FIG. 5 shows a second example of MEMS device of the invention.

FIG. 5 shows a second example of MEMS device of the invention, which adds one or more stops 60 to the design explained with reference to FIG. 4. These stops prohibit the top electrode 46 from making large upward deflections. When the electrode touches the stop 60, this absorbs energy and damps the oscillations. Moreover, the small air gap between the stop 60 and the top electrode 46 provides increased squeeze film damping when the relaxed position of the second electrode is reached.

Figure 6:
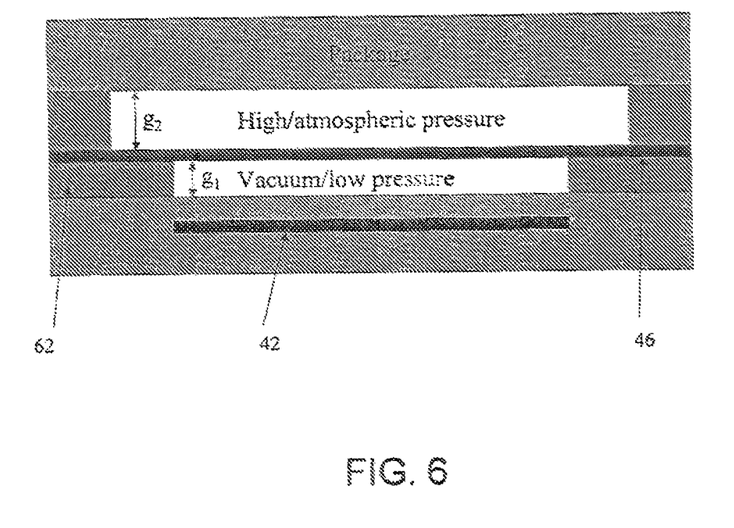
FIG. 6 shows a third example of MEMS device of the invention.

FIG. 6 shows a modification to the design of FIG. 4, in which the top electrode 46 is clamped in an absorbing viscoelastic material 62 (plastic, resist, polymer). This can absorb the mechanical energy and also reduce oscillations.

Figure 7:
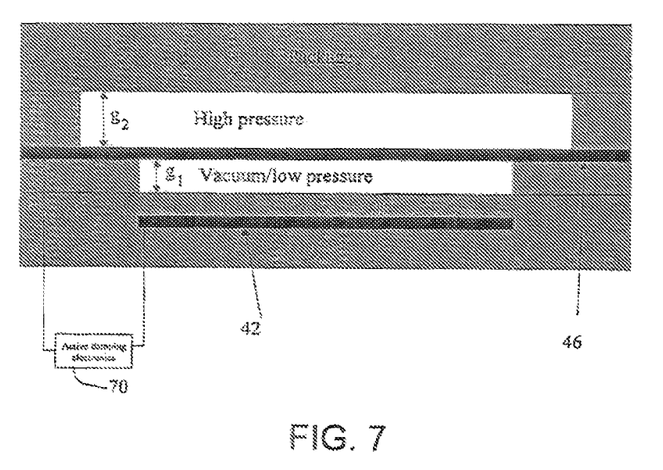
FIG. 7 shows a fourth example of MEMS device of the invention.

FIG. 7 shows a fourth example of MEMS device of the invention in which active damping electronics 70 is used to provide damping. This controls the voltage profiles applied to the electrodes. This may not be a preferred implementation because high voltages are required and complicated control circuitry needs to be added. However, electrical damping of the oscillations can be achieved in more simple manner using the arrangement shown in FIG. 8.

Figure 8:
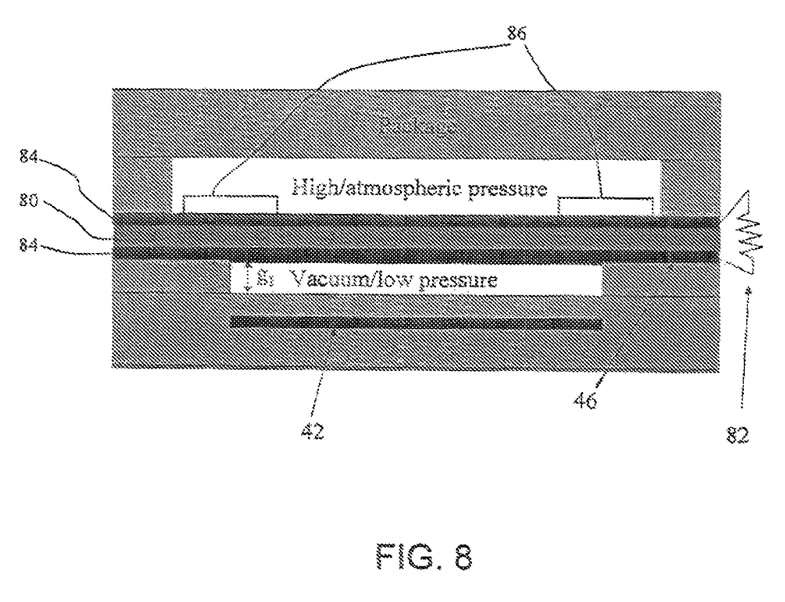
FIG. 8 shows a fifth example of MEMS device of the invention.

In FIG. 8, a piezoelectric layer 80 is used to convert the mechanical energy of the switch to electrical energy which is dissipated in a resistor 82 (a different circuit can be used). This energy dissipation will again reduce the oscillations shown in FIG. 3.

In this arrangement, the second electrode 46 comprises an assembly of a piezoelectric layer 80 sandwiched between conductor layers 84. Electrodes 86 are also shown for piezoelectric actuation. Piezoelectric actuation can be used for active damping of the oscillations in the switch by inducing bending in the electrode layer which tends to reduce the bending/oscillations which have been induced.

The use of piezoelectric layer can enable active damping to be implemented more easily.

From the various examples above, it can be seen that the invention enables a decrease in the switching time of a MEMS switch, by creating a partial vacuum between the plates of the switch to reduce squeeze film damping. This would normally be considered to introduce the problem of undesired oscillations which increase the opening time of the switch. These oscillations are then damped by providing a higher pressure controlled gap above the top electrode.

Additional measures can then be employed to improve the damping, such as stops to limit the amplitude of the oscillations and absorb their energy, clamping of the electrode in a viscoelastic material, active damping electronics and piezoelectric damping via a resistor or active damping electronics.

The forming of the low pressure cavity will be routine to those skilled in the art. In particular, MEMS devices typically require a hermetic package, and the semiconductor processes are performed in an evacuated chamber, so that the required low pressure encapsulation is not difficult to achieve.

An example of manufacturing method is shown in FIGS. 9 to 17.

Figure 9:
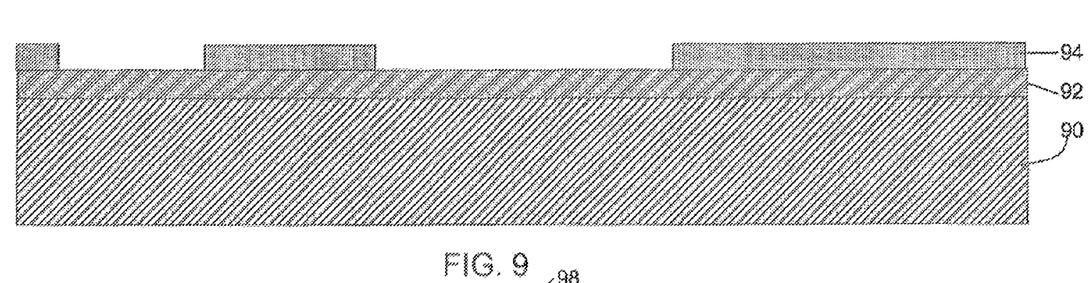
FIGS. 9 to 15 show an example of process sequence for forming a cavity between switch electrodes.

FIG. 9 shows the substrate 90 with a thermal oxide passivation layer 92, for example 1 µm thick. It also shows the patterned bottom electrode 94 for example formed from 30 nm Cr and 250 nm Au. This patterning uses a first mask.

Figure 10:
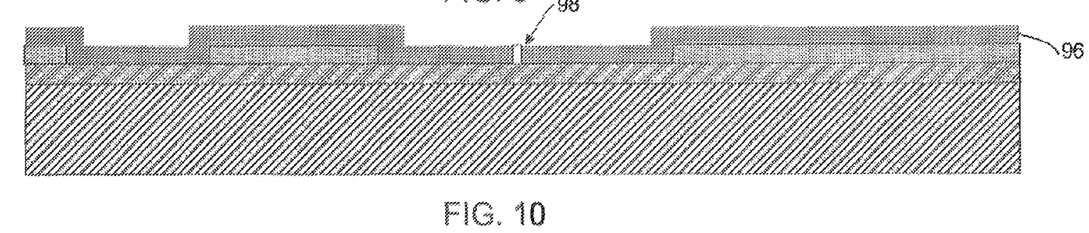
Figure 11:
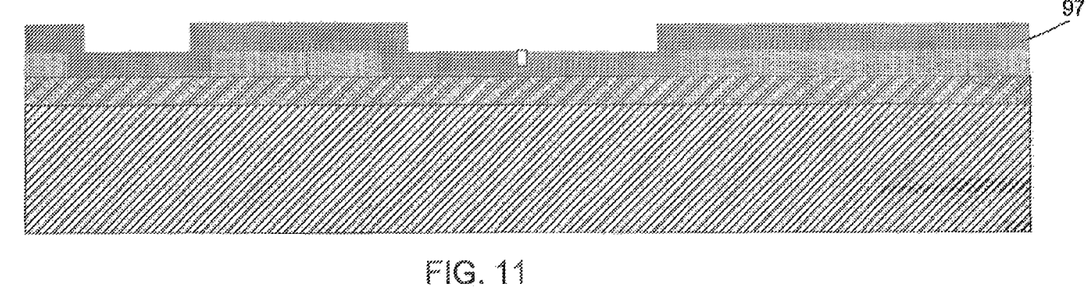

FIG. 10 shows a sacrificial layer 96, for example 150 nm Mo which has been structured using mask number 2a to form opening 98.

The opening is used to enable an electrode shape to be defined which has bumps on the underside. These can be used to act as electrical contacts. As will become evident from FIG. 17, these bumps will be positioned over the bottom electrode, but this is not shown in FIGS. 9 to 15 in order to keep the diagrams simple.

A second sacrificial layer 97 has been deposited in FIG. 11, again of 150 nm Mo, so that the opening 98 is partially filled.

Figures 12, 13:
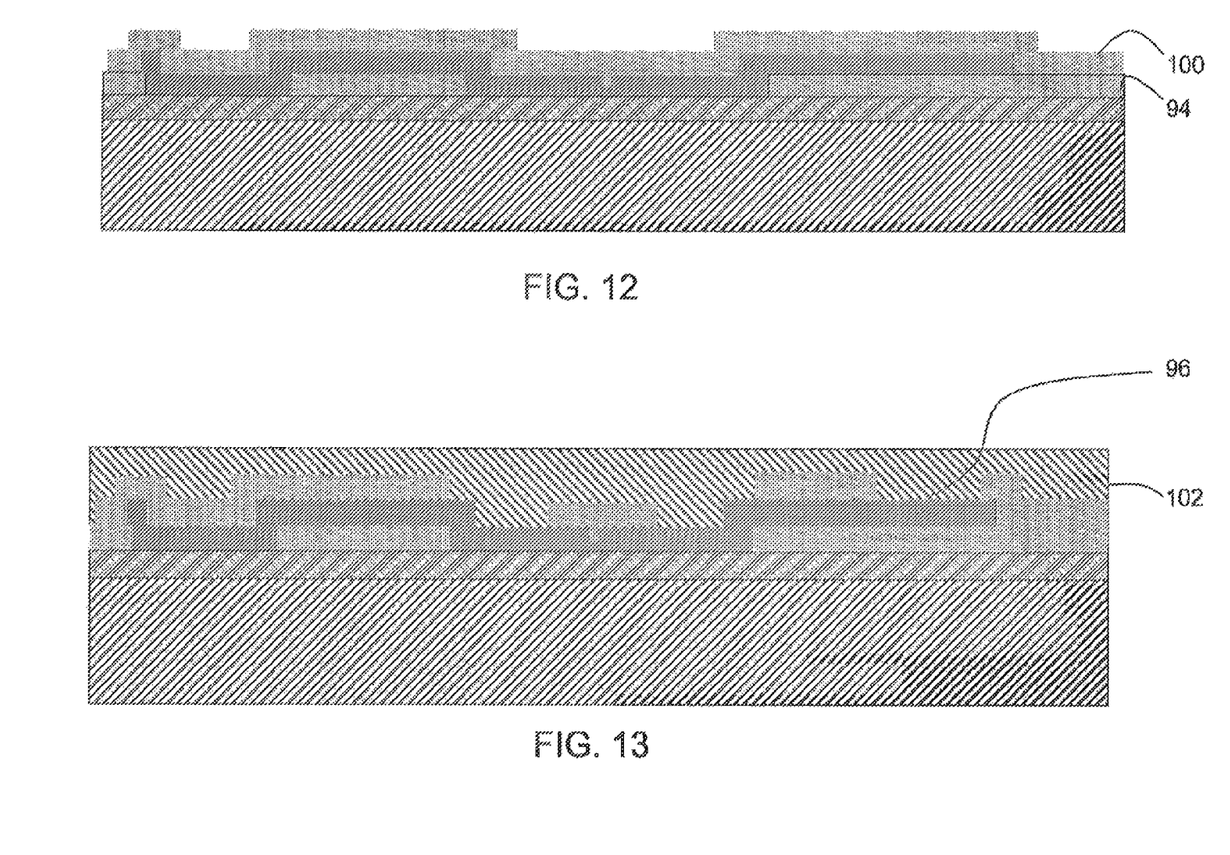

The double sacrificial layer is then patterned with a mask step number 2b, and a top electrode 100 is deposited, resulting in the structure shown in FIG. 12. The top electrode can comprise 250 nm of Au and 30 nm Cr, namely the same composition as the bottom electrode. This top electrode is then patterned, using mask 3.

A structural layer 102 is then deposited over the structure, for example 20 nm $SiO_2$ and 400 nm SiN by PECVD deposition, resulting in the structure shown in FIG. 13. This layer 102 provides an insulating connection between the different parts of the layer defining the second electrode, so that these parts all move up and down together.

Figure 14:
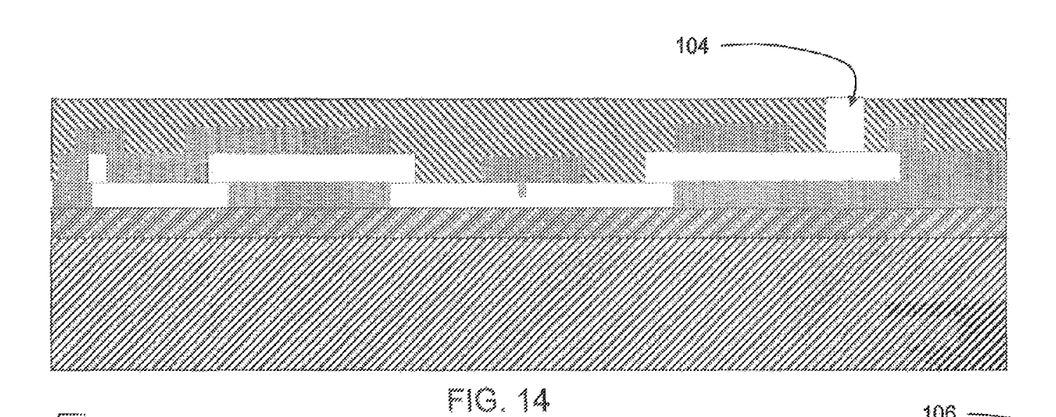

Sacrificial layer holes 104 are etched with mask 4, and these are used to remove the Mo sacrificial layer 96 by a wet etch, followed by drying, to give the arrangement of FIG. 14.

Figure 15:
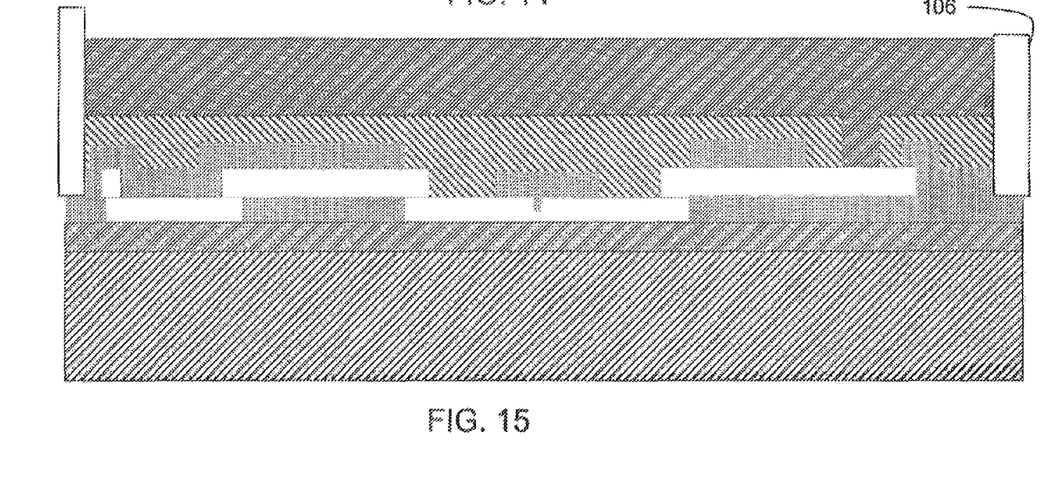

A plug layer 106 is shown in FIG. 15, for example 600 nm SiN or TEOS in order to plug the sacrificial layer holes. FIG. 15 also shows bondpads having been opened with a mask number 5.

Figure 16:
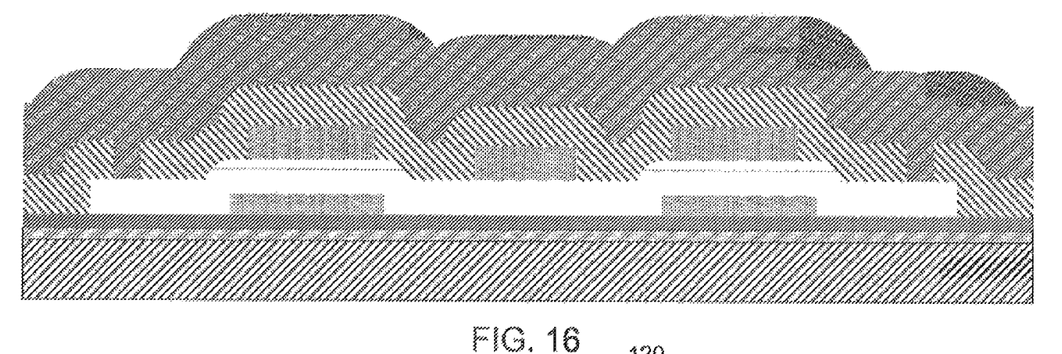
FIGS. 16 and 17 show two cross sections of resulting device structure.
Figure 17:
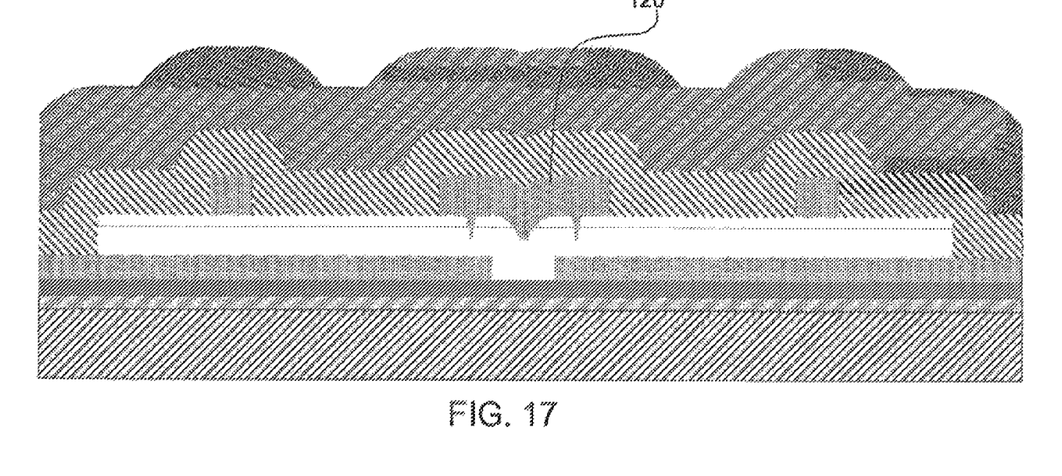

FIGS. 16 and 17 show cross sections of a structure which can be made using the processing concepts explained above. The position of these cross sections can be seen from the plan view of FIG. 18.

Figure 18:
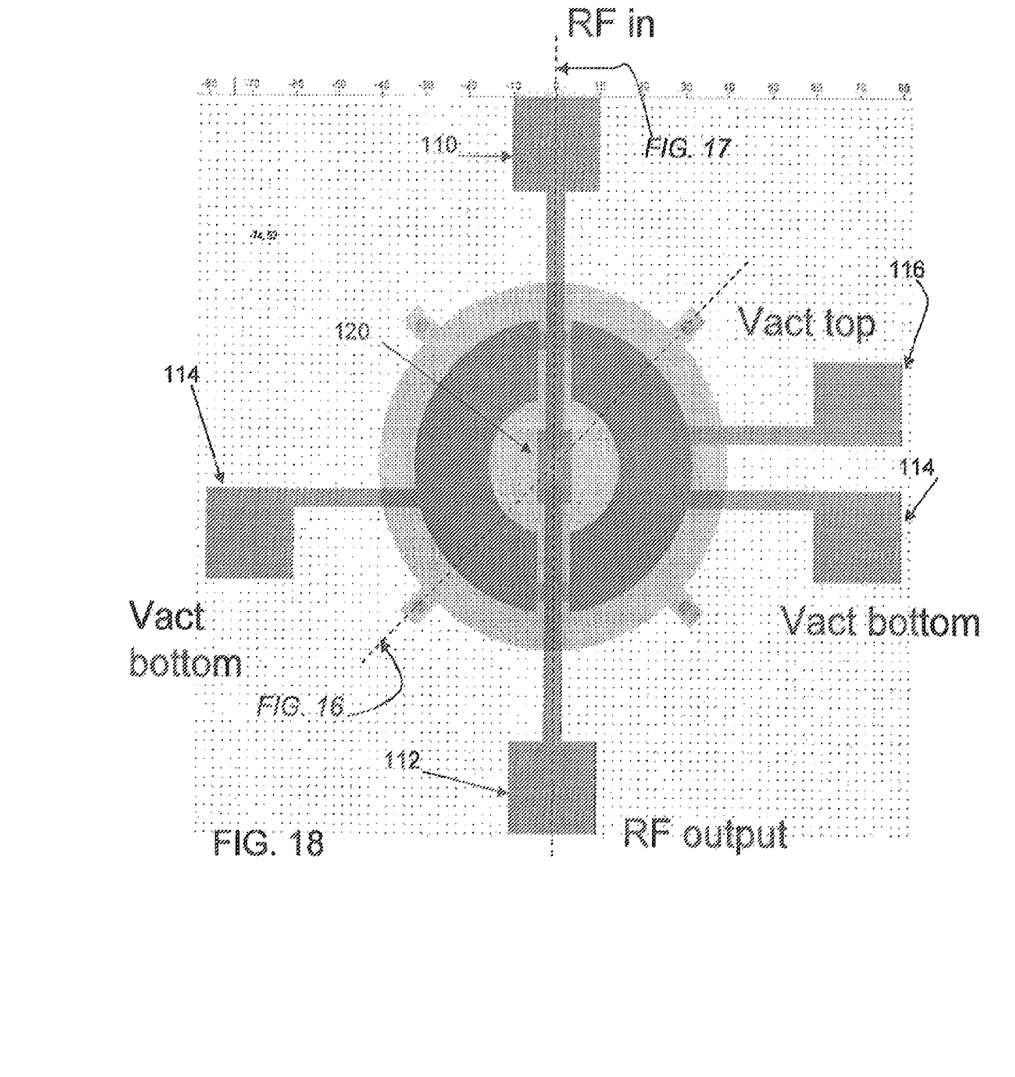
FIG. 18 shows an example of device layout in plan view.

FIG. 18 shows an RF input 110, an RF output 112, bottom electrode contact pads 114 and a top electrode contact pad 116. The bottom electrode is patterned as two sections, one on each side of the line of the RF input and output lines, because they are all formed from the same bottom metal layer. The top electrode is a single continuous electrode, spaced above the bottom electrode by the cavity formed using the sacrificial etching method as explained above.

A central top electrode area 120 functions as the contact between the input and output lines, and is connected to the other top electrode by the structural layer 102 so that all regions of the top electrode move together. Thus, when the main electrode areas are brought together, the area 120 makes electrical contact between the RF input and output lines. The area 120 has contact bumps on the under surface.

FIG. 17 shows that these contact bumps are in fact provided over the lower electrode, which is not shown in the simplified diagrams of FIGS. 9 to 15.

The steps shown in FIGS. 9 to 17 demonstrate how a cavity can be formed between the top and bottom electrodes. The top cavity above the top electrode is not shown, and this can be made either by placing a cap above the switch membrane or by a sacrificial process similar to that described above.

In the figures, the structure of the device is shown only schematically. The top electrode and structural layer is designed to seal the lower chamber. The detailed implementation will be routine to those skilled in the art of MEMS devices.

The example above shows capacitive switches, but the invention can also apply to galvanic switches or other MEMS devices in which mechanical contact is made and released.

Various modifications will be apparent to those skilled in the art.

The invention claimed is:

1. A MEMS switch or tunable capacitor device comprising:
first and second opposing electrodes, wherein the second electrode is electrically movable to vary the electrode spacing between facing first sides of the first and second electrodes, wherein the second electrode is at a spaced position from the first electrode in a relaxed state in which no voltages are applied to the electrodes,
wherein a first gas chamber is provided between the electrodes, at a first pressure, and a second gas chamber is provided on the second, opposite, side of the second electrode at a second pressure which is higher than the first pressure, and
wherein the first gas chamber has a height of between 50 nm and 50 µm and the second gas chamber has a height of between 1 µm and 200 µm.

2. A device as claimed in claim 1, wherein the first gas chamber is at a pressure below 500 mbar, and the second gas chamber is at atmospheric pressure or higher than atmospheric pressure.

3. A device as claimed in claim 1, wherein the first gas chamber is at a pressure below 100 mbar.

4. A device as claimed in any preceding claim, wherein the second gas chamber (52) is at atmospheric pressure.

5. A device as claimed in claim 1, wherein one or more stops are provided in the second gas chamber, for limiting movement of the second electrode away from the first electrode.

6. A device as claimed in claim 1, wherein the second electrode is clamped between elastic members around a portion of the second electrode which defines the outer periphery of the first and second gas chambers.

7. A device as claimed in claim 1, wherein the second electrode comprises a metal electrode layer, a piezoelectric layer and a circuit for dissipating electrical energy generated by the piezoelectric layer.

8. A device as claimed in claim 7, further comprising a circuit for controlling the actuation of the piezoelectric layer to provide active damping.

9. A device as claimed in claim 1 comprising a MEMs switch.

10. A device as claimed in claim 1 comprising a capacitive switch, having a dielectric layer between the first and second electrodes.

11. A device as claimed in claim 1 comprising a galvanic switch, in which the second electrode is movable to make and break contact with the first electrode.

12. A method of controlling the movement of an electrically movable electrode of a MEMS switch or tunable capacitor device towards and away from a fixed electrode, wherein the movable electrode is at a spaced position from the fixed electrode in a relaxed state in which no voltages are applied to the electrodes, the method comprising:
 providing a first gas chamber provided between the electrodes with a first pressure wherein the first gas chamber has a height of between 50 nm and 50 µm;
 providing a second gas chamber on an opposite side of the movable electrode facing away from the fixed electrode with a second pressure which is higher than the first pressure wherein the second gas chamber has a height of between 1 µm and 200 µm.

13. A device as claimed in claim 1, where the height of the second gas chamber is larger than the height of the first gas chamber.

* * * * *